(12) United States Patent
Damaraju et al.

(10) Patent No.: US 10,509,447 B2
(45) Date of Patent: Dec. 17, 2019

(54) THERMAL SHIELD CAN FOR IMPROVED THERMAL PERFORMANCE OF MOBILE DEVICES

(71) Applicant: NVIDIA Corporation, Santa Clara, CA (US)

(72) Inventors: Srinivasa Damaraju, Pleasanton, CA (US); Chandra Madichetty, Sunnyvale, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 14/855,996

(22) Filed: Sep. 16, 2015

(65) Prior Publication Data

US 2017/0075396 A1    Mar. 16, 2017

(51) Int. Cl.
| | |
|---|---|
| G06F 1/20 | (2006.01) |
| H05K 7/20 | (2006.01) |
| G06F 1/16 | (2006.01) |
| H05K 9/00 | (2006.01) |
| H01L 23/427 | (2006.01) |

(52) U.S. Cl.
CPC ............ G06F 1/203 (2013.01); G06F 1/1656 (2013.01); G06F 1/206 (2013.01); H05K 9/0026 (2013.01); *H01L 23/4275* (2013.01)

(58) Field of Classification Search
CPC .... G06F 1/203; G06F 1/1613; H05K 7/20409
USPC .................................................... 361/679.54
See application file for complete search history.

(56) References Cited

U.S. PATENT DOCUMENTS

| | | | | |
|---|---|---|---|---|
| 4,912,548 A | * | 3/1990 | Shanker | H01L 23/427 165/104.33 |
| 5,006,924 A | * | 4/1991 | Frankeny | H01L 23/42 165/46 |
| 5,060,114 A | * | 10/1991 | Feinberg | H01L 23/433 165/185 |
| 5,660,758 A | * | 8/1997 | McCullough | B29C 45/2618 249/145 |
| 5,720,338 A | * | 2/1998 | Larson | F28D 15/0241 165/104.26 |
| 6,237,223 B1 | * | 5/2001 | McCullough | B23P 15/26 257/E23.089 |
| 6,381,845 B2 | * | 5/2002 | Ikeda | F28D 15/0233 257/E23.088 |
| 6,926,955 B2 | * | 8/2005 | Jayaraman | C08K 3/08 428/323 |
| 7,369,410 B2 | * | 5/2008 | Chen | F28D 15/0233 165/104.21 |
| 7,411,790 B2 | * | 8/2008 | Huang | H01L 23/427 165/104.33 |
| 8,587,945 B1 | * | 11/2013 | Hartmann | H05K 7/20454 361/679.53 |
| 8,739,406 B2 | * | 6/2014 | Campbell | B23P 15/26 29/890.035 |
| 9,226,428 B2 | * | 12/2015 | Pidwerbecki | H05K 7/2039 |

(Continued)

*Primary Examiner* — Anatoly Vortman

(57) ABSTRACT

The invention is directed to a novel solution for improving heat management in computing devices by using thermally active material integrated within a shield can disposed over an integrated circuit or printed circuit board. By integrating the thermally active material within the shield can, isothermal conditions can be maintained for a longer period of time, thereby extending the transient state of a heat-producing system for longer durations, while maintaining slim vertical profiles.

9 Claims, 7 Drawing Sheets

(56) References Cited

U.S. PATENT DOCUMENTS

| | | | |
|---|---|---|---|
| 9,436,235 B2* | 9/2016 | Damaraju | G06F 1/20 |
| 2002/0056908 A1* | 5/2002 | Brownell | F28D 15/0266 |
| | | | 257/714 |
| 2002/0105071 A1* | 8/2002 | Mahajan | H01L 23/36 |
| | | | 257/720 |
| 2005/0022975 A1* | 2/2005 | Rosenfeld | B22F 3/1103 |
| | | | 165/104.11 |
| 2006/0039111 A1* | 2/2006 | Huang | H01L 23/427 |
| | | | 361/698 |
| 2010/0302725 A1* | 12/2010 | Busch | F28D 15/0233 |
| | | | 361/679.47 |
| 2014/0002998 A1* | 1/2014 | Pidwerbecki | H05K 7/2039 |
| | | | 361/717 |
| 2014/0240918 A1* | 8/2014 | Damaraju | G06F 1/20 |
| | | | 361/679.47 |

* cited by examiner

100

300

400

THERMAL SHIELD CAN FOR IMPROVED THERMAL PERFORMANCE OF MOBILE DEVICES

FIELD OF THE INVENTION

This present invention refers to techniques for managing a thermal performance of computing devices. In particular, the present invention relates to a system and methods for implementing improved thermal performance in mobile computing devices such as mobile telephones, tablets, smart-devices, hand-held video game consoles, or any such device with limited space and where thermal management is a consideration.

BACKGROUND OF THE INVENTION

The prevailing design methodology goals of mobile computing devices (such as smart phones, tablets devices, netbooks, personal data assistants, portable media devices, wearable devices, etc.) is to achieve slimmer profiles while providing ever increasing memory, processing and graphical rendering capabilities, and larger display sizes.

A popular configuration of a mobile computing device includes a main printed circuit board (PCB) having one or more processing elements. These processing elements product heat during operation. However, since the size of the entire device (as a function of a smaller form factor) is limited, less space is available for and between each element. The tighter stack heights and thinner profiles limit the use of conventional thermal control techniques like heat sinks, fans, etc. That not only makes heat dissipation more critical, but also presents additional challenges for heat distribution and dispersal. Moreover, other components (such as camera modules, battery modules, etc.) also generate heat—at least intermittently—during operation.

To address the heat management issue, recently proposed solutions have incorporated materials with phase changing properties for thermal management. Proposed implementations include liquid vapor phase change material in vapor chambers. However, while these chambers are adequate for distributing heat, vapor chambers are less suitable for temporary heat retention, which may be helpful for maintaining consistent operating conditions in a device.

SUMMARY OF THE INVENTION

This Summary is provided to introduce a selection of concepts in a simplified form that are further described below in the Detailed Description. This Summary is not intended to identify key features or essential features of the invention, nor is it intended to be used to limit the scope of the invention.

An aspect of the present invention proposes a system for absorbing and managing heat in a mobile computing device by depositing thermally active material within a electromagnetic interference (EMI) shield can surrounding a printed circuit board or integrated circuit. According to these embodiments, a shield can is provided with integrated thermally active material that includes phase change material (PCM) or mixed PCM sheet metals or metal alloys that is molded into a composite substance. The thermal management of the shield can is improved through the integration of the thermally active material, since the features will typically have significantly higher latent heat capacitance than the composite materials of the shield itself.

According to one aspect of the present invention, a mobile consumer electronics device—such as a mobile phone, wearable computing device, or tablet—is provided with a shield can with improved thermal management capabilities is created by depositing phase-changing material (PCM) directly over an integrated circuit and printed circuit board of a mobile device in a controlled volume, followed by an all around edge-soldering of the shield can over the PCM to prevent any leakage of the PCM during temperature variations.

According to another aspect of the present invention, a mobile consumer electronics device—such as a mobile phone, wearable computing device, or tablet—is provided with a shell of a shield can that is formed from combining two shields of slightly different sizes so as to encapsulate a cavity. PCM is introduced into the cavity after the (modified) shield can structure is soldered down to the PCB during a surface mount procedure. According to these embodiments, heat produced during the operation of the processing components on the PCB is retained in the thermally active material integrated within the shield can.

According to yet another aspect, a method is provided that combines the above two processes wherein a PCM is deposited over an integrated circuit or PCB before a shield can shell with a cavity is soldered over the PCB, and additional PCM is further injected into the cavity of the shield can after soldering via surface mount technology (TSM) procedure.

According to the various aspects described above, the phase change material absorbs the heat produced by the processing components. When the heat exceeds the melting point of the phase change material, the phase change material melts to absorb additional heat, keeping the processing components isothermal or nearly isothermal for a longer period of time. The phase change material solidifies when operation of the processing components is discontinued and the temperature in the system cools. Through the integration of the phase change material(s), systems with internal performance throttling mechanisms to reduce heat production may delay performance throttling, allowing longer periods of high performance usage.

BRIEF DESCRIPTION OF THE DRAWINGS

The accompanying drawings are incorporated in and form a part of this specification. The drawings illustrate embodiments. Together with the description, the drawings serve to explain the principles of the embodiments.

DETAILED DESCRIPTION

Figure 1:
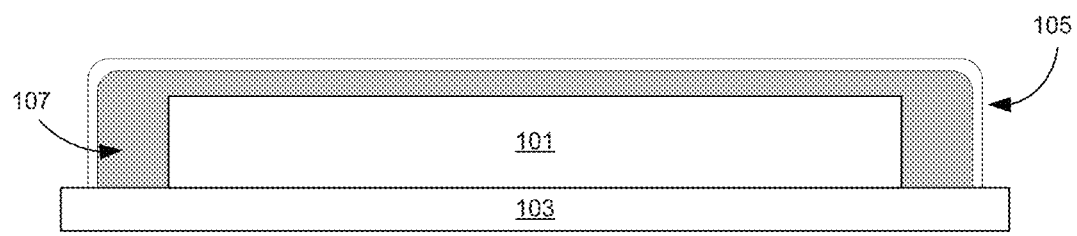
FIG. 1 depicts a first exemplary component layer stack of a mobile computing device, in accordance with various embodiments of the present invention.

Reference will now be made in detail to the preferred embodiments of the invention, a method and system for the use of a shield can of a mobile computing device with improved heat management capability, examples of which are illustrated in the accompanying drawings. While the invention will be described in conjunction with the preferred embodiments, it will be understood that they are not intended to be limit to these embodiments. On the contrary, the invention is intended to cover alternatives, modifications and equivalents, which may be included within the spirit and scope as defined by the appended claims.

Furthermore, in the following detailed descriptions of embodiments of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions that follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer generated step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing," "creating," "protecting," "receiving," "encrypting," "decrypting," "destroying," or the like, refer to the action and processes of a computer system or integrated circuit, or similar electronic computing device, including an embedded system, that manipulates and transforms data represented as physical (electronic) quantities within the computer system's registers and memories into other data similarly represented as physical quantities within the computer system memories or registers or other such information storage, transmission or display devices.

Embodiments of the invention are directed to novel solutions for improving heat management in computing devices by using thermally active material integrated within a shield can disposed over an integrated circuit or printed circuit board. By integrating the thermally active material within the shield can, isothermal conditions can be maintained for a longer period of time, thereby extending the transient state of a heat-producing system for longer durations, while maintaining slim vertical profiles.

Shield Cans with Integrated Phase Changing Materials

In mobile devices, a shield layer or "shield can" may be used to prevent electro-magnetic interference (EMI) from reaching sensitive components (e.g., circuits). Shield cans may also provide benefits in thermal management such as heat spreading and heat retention by using materials with high heat latency and/or high heat conductivity to conduct heat away from a heat source. According to one or more embodiments, a shield can of a mobile device may be implemented as a sheet metal comprised of drawn or folded parts disposed over and surrounding a component such as one or more circuits on a circuit board.

FIG. 1 represents a profile of a first exemplary component layer stack 100 of a printed circuit board (PCB) 103, according to embodiments of the invention. The PCB 103 may be implemented in, for example, a mobile device such as a mobile phone, a tablet device, a netbook, a laptop device, a video game console, a personal data assistant, a media player, a wearable computing device, or any computing system or mobile computing device where excess generated heat is a concern, heat management is an interest, and/or a slimmer profile may be desirable. As depicted in FIG. 1, a component layer stack 100 includes a main printed circuit board (PCB) 103 that supports an integrated circuit (IC) 101. In one or more embodiments, IC 101 performs processing and/or graphics rendering in the mobile device. IC 101 may include, for example, one or more central processing units (CPUs), graphics processing units (GPUs), application processors (APs), multi-processors, special purpose processors, and/or one or more system on a chip (SOCs).

As depicted in FIG. 1, the component layer stack 100 may include a shield can 105 configured to shield, obstruct, or block electromagnetic waves from reaching the components of the PCB 101. The shield layer 105 may be implemented as for example, copper, nickel, stainless steel, and/or metal alloys. According to embodiments of the invention, the air that may be traditionally enclosed along with the IC by the shield can is replaced, in whole or in part with thermally active material 107. The thermally active material 107 may be implemented as, for example, a volume or layer of phase change material (PCM) that is operable to absorb and retain heat produced by the IC 101.

According to one or more embodiments, the configuration depicted in FIG. 1 may be produced by mounting the IC 101 to the PCB 103, depositing the layer of PCM 107 over IC 101 in a controlled volume, disposing the shield can 105 over the volume of PCM 107, and soldering the perimeter of the shield can 105 at the junction with the PCB 103. In further embodiments, the thermally active material 123 may be implemented from phase change materials such as: solid-liquid PCM, liquid-vapor PCM; and crystalline to amorphous structure PCM. Desirable qualities exhibited by a PCM according to embodiments of the invention include high latent heat capacity, high thermal conductivity, low thermal expansion, and high specific heat. According to these embodiments, via the integration of the phase change materials between the shield can and the IC 101, the IC 101 is able to remain isothermal or substantially isothermal during operation at high performance levels, through the phase change of the PCM (e.g., melting of the solid-liquid PCM, vaporization of the liquid-vapor PCM, and liquefying of the crystalline to amorphous structure PCM) and, as such, to dissipate the heat generated at higher performance levels for a longer duration.

During operation, IC components produce temperatures based on a level of activity/performance, with components performing at higher levels naturally producing higher temperatures. According to one or more embodiments, the IC 101 may be configured to reduce or "throttle" performance when the temperature in the system reaches or exceeds a pre-determined threshold. The threshold may correspond, for example, to a "skin temperature" at which the palpable heat emanating from the device becomes noticeable and/or uncomfortable to a user of the device. According to one or more embodiments, the threshold may correspond to the upper range of safe operating limits corresponding to the particular component (e.g., as provided by the component's manufacturer), also known as the "junction temperature."

According to one or more embodiments, this junction temperature also corresponds to a steady state condition, which occurs when the thermal equilibrium condition of system components dissipates power (heat) at a rate equal to the net heat loss to the ambient environment, resulting in no temperature change in the components of the device. Transient conditions are characterized by a variation of device component temperatures with time, and correspond to the thermal condition of the IC 101 once operation begins and until the temperature in the system reaches the steady state condition. During the transient state, the heat dissipated within the components of the system is not equal to the heat loss to the ambient environment, resulting in changing temperatures in the components with time.

Through the integration of the phase change materials within the shield can, the heat produced during operation can be absorbed for a portion (or entirety, depending on use) of the device's operation, extending the transient condition and delaying the steady state condition such that the reduction or throttling of the performance is delayed or even avoided entirely. This allows the mobile computing device to maintain high performance levels longer than conventional implementations while maintaining the same vertical profile.

Figure 2:
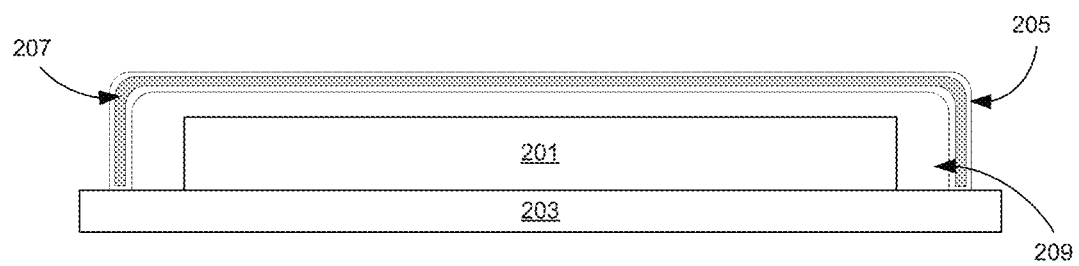
FIG. 2 depicts a second exemplary component layer stack of a mobile computing device, in accordance with various embodiments of the present invention.

FIG. 2 depicts a second exemplary component layer stack 200 of a mobile computing device, in accordance with various embodiments of the present invention. As depicted in FIG. 2, the second exemplary component layer stack 200 also includes an IC 201 mounted to a PCB 203, a shield can 205 with a cavity, a phase changing material 207 deposited in a cavity provided by the shield can 205, and a layer of air 209 disposed between the shield can 205 and the IC 201. In an embodiment, each of the elements 201-207 is similar to like numbered elements (e.g., 101-107) described above with respect to FIG. 1.

In one or more embodiments, the shield can 205 in component layer stack 200 is formed by placing a second "exterior" shield can over a first, smaller "interior" shield can so as to form a cavity of a consistent height between the two shield can layers. This cavity can be filled with the thermally active PCM material 207. According to one or more further embodiments, a layer of air 209 may be maintained between the interior shield can and the IC 201 as an additional heat management layer.

Figure 3:
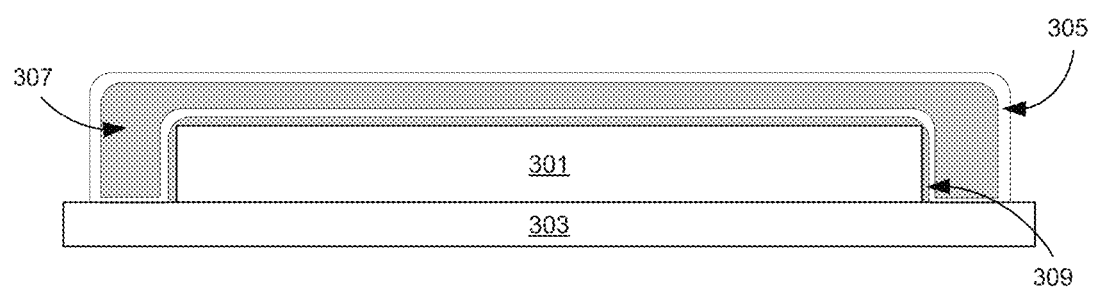
FIG. 3 depicts a third exemplary component layer stack of a mobile computing device, in accordance with various embodiments of the present invention.

FIG. 3 depicts a third exemplary component layer stack 300 of a mobile computing device and a variation of the component layer stack 200 depicted in FIG. 2, in accordance with various embodiments of the present invention. As depicted in FIG. 3, the third exemplary component layer stack 300 also includes a PCB 301, a shield can 305 with a cavity, a phase changing material 307 deposited in the cavity of the shield can 305, and a layer of air 309 disposed between the shield can 305 and the IC 301. In an embodiment, each of the elements 301-309 is similar to like numbered elements (e.g., 201-209) described above with respect to FIG. 2.

In one or more embodiments, the shield can 305 in component layer stack 300 is formed by placing a second exterior shield can over a first, significantly smaller interior shield can so as to form a larger (relative to the embodiment depicted in FIG. 2) cavity between the two shield can layers. In one or more embodiments, the volume formerly occupied by the layer of air 309 may be reduced relative to the embodiment depicted in FIG. 2 to accommodate the larger volume in the cavity such that the profile height of the component layer stack 300 remains unaffected.

Figure 4:
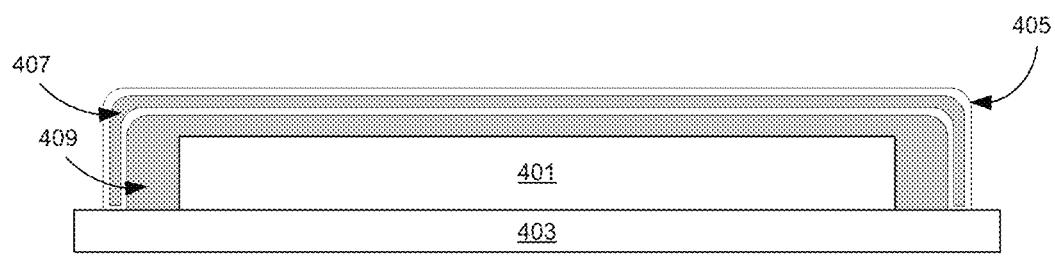
FIG. 4 depicts a fourth exemplary component layer stack of a mobile computing device, in accordance with various embodiments of the present invention.

FIG. 4 depicts a fourth exemplary component layer stack of a mobile computing device, in accordance with various embodiments of the present invention. As depicted in FIG. 4, the fourth exemplary component layer stack 400 also includes an IC 401 mounted on a PCB 403, a shield can 405 with a cavity, a phase changing material 407 deposited in the cavity provided by the shield can 405, and another layer or volume of PCM 409 disposed between the shield can 405 and the IC 401.

In one or more embodiments, the shield can 405 in component layer stack 400 is formed by placing a second "exterior" shield can over a first, smaller "interior" shield can so as to form a cavity of a consistent height between the two shield can layers. This cavity can be filled with the thermally active PCM material 407. According to one or more further embodiments, a second layer or volume of PCM material 209 may be deposited between the interior shield can and the IC 401 to provide still more heat management capability.

Figure 5:
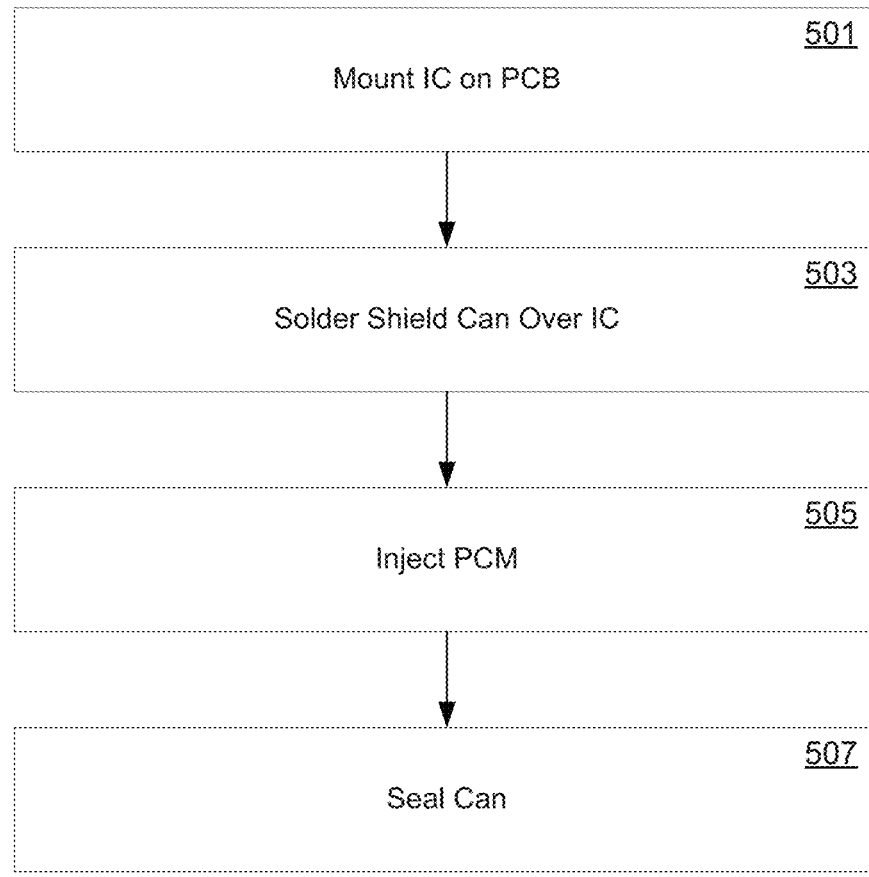
FIG. 5 depicts a flowchart of an exemplary process for manufacturing a mobile computing device with integrated thermally active material, in accordance with various embodiments of the present invention.

FIG. 5 depicts a flowchart 500 of an exemplary process for manufacturing a mobile computing device with integrated thermally active material, in accordance with various embodiments of the present invention. Steps 501-507 are exemplary steps of the flowchart 500 in accordance with the various embodiments herein described.

In one or more embodiments, an IC is mounted to a PCB at step 501. In one or more embodiments, the IC may include, for example, one or more central processing units (CPUs), graphics processing units (GPUs), application processors (APs), multi-processors, special purpose processors, one or more system on a chip (SOCs), and/or one or more components for which insulation from electromagnetic radiation is desirable. According to one of more embodiments, the IC may be mounted to the PCB using a surface mount technology (SMT) technique.

At step 503, a shield can is disposed over the IC. In one or more embodiments, the shield can is disposed over the IC so as to completely enclose the IC between the shield can and the PCB. In one or more embodiments, the shield can may comprise a drawn and/or folded sheet of metal or metal alloy with high heat latency and conductivity that prevents penetration by electromagnetic waves, such as copper, stainless steel, etc. In one or more embodiments, the shield can may also consist of or other composite substances with similar properties, that include, for example silicone, elastomer, etc. In still further embodiments, the shield can may be soldered to the IC during step 503.

At step 505, a phase-changing material (PCM) is deposited between an exterior surface of the shield can and the IC. In one or more embodiments, disposing the shield can over the IC at step 503 also forms an air gap between the shield can and the IC. According to one or more embodiments, the PCM is deposited in the gap at step 505. In one or more embodiments, the PCM is deposited as a layer directly over the top and side surfaces of the IC. In one or more further embodiments, the gap is substantially filled by the deposited PCM such that the PCM contacts with the interior surface of the shield can.

Finally, at step 507, the exterior perimeter of the shield can in contact with the PCB is soldered to seal in the PCM. Thereafter, a transient state of the IC may be extended by the thermal management properties of the PCM material enclosed by the shield can, which may delay or prevent a throttling of a performance of the IC due to excessive heat.

Figure 6:
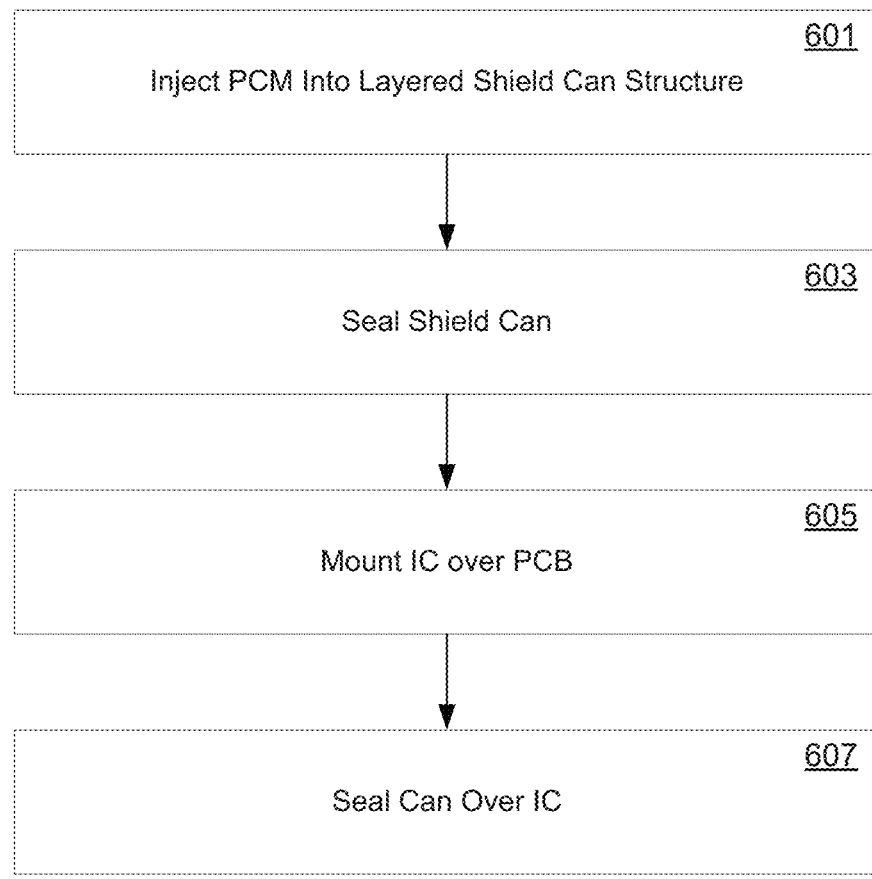
FIG. 6 depicts a flowchart of a second exemplary process for manufacturing a mobile computing device with integrated thermally active material, in accordance with various embodiments of the present invention.

FIG. 6 depicts a flowchart 600 of a second exemplary process for manufacturing a mobile computing device with integrated thermally active material, in accordance with various embodiments of the present invention. Steps 601-607 describe exemplary steps of the flowchart 600 in accordance with the various embodiments herein described.

In one or more embodiments, PCM is injected at step 601 in a cavity of a shield can structure that comprises two separate shield can layers. In one or more embodiments, the two separate shield can layers may be implemented from two separate layers of slightly different sizes, such that the outer shield can layer completely encapsulates the inner shield can layer with a cavity (and PCM) between the two layers. In one or more embodiments, one or both of the shield can layers may comprise a drawn and/or folded sheet of metal or metal alloy with high heat latency and conductivity that prevents penetration by electromagnetic waves, such as copper, stainless steel, etc. In one or more embodiments, the shield can may also consist of or other composite substances with similar properties, that include, for example silicone, elastomer, etc.

At step 603, the shield can layers are sealed so as to completely enclose the PCM material injected in the cavity between the shield can layers at step 601. An IC is mounted to a PCB at step 605. As described above with respect to FIG. 5, the IC may likewise include, for example, one or more central processing units (CPUs), graphics processing units (GPUs), application processors (APs), multi-processors, special purpose processors, one or more system on a chip (SOCs), and/or one or more components for which insulation from electromagnetic radiation is desirable. According to one of more embodiments, the IC may be mounted to the PCB using a surface mount technology (SMT) technique.

Finally, at step 607, the exterior perimeter of the second shield can layer in contact with the PCB is soldered to seal in the PCM.

Figure 7:
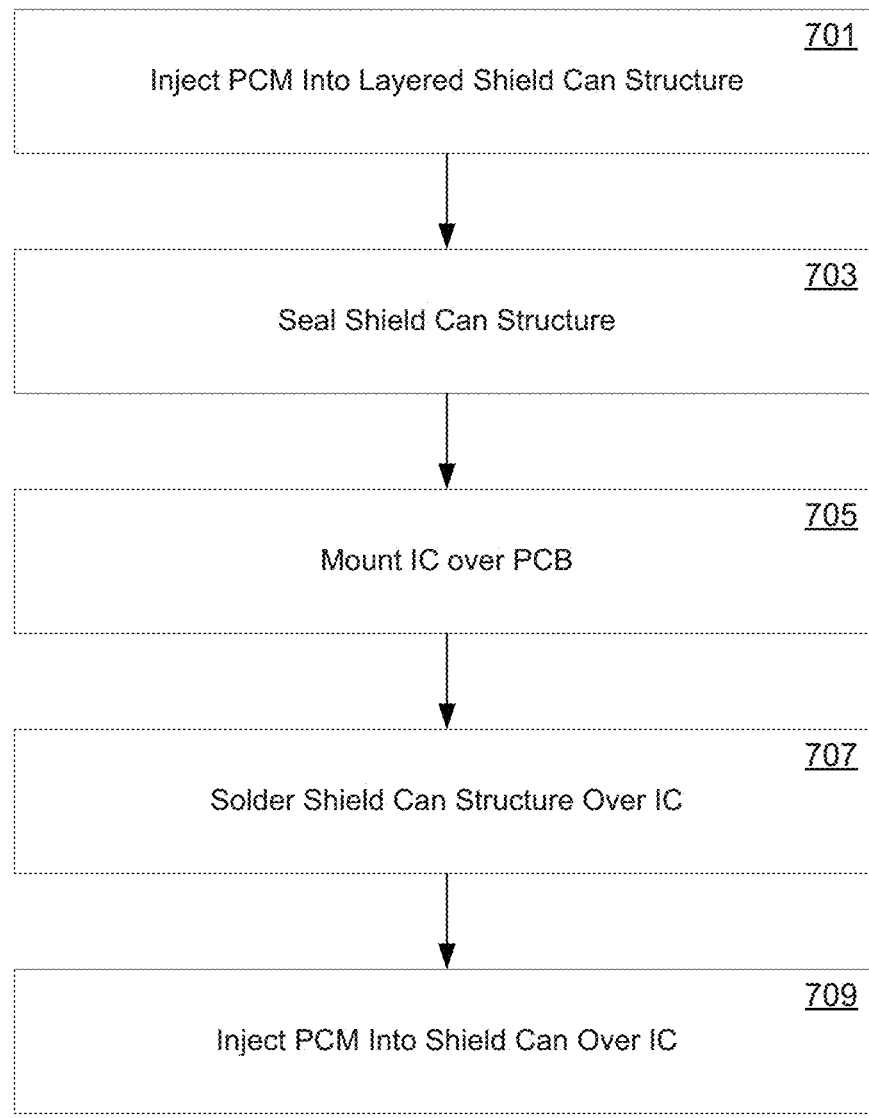
FIG. 7 depicts a flowchart of a third exemplary process for manufacturing a mobile computing device with integrated thermally active material, in accordance with various embodiments of the present invention.

FIG. 7 depicts a flowchart 700 of a third exemplary process for manufacturing a mobile computing device with integrated thermally active material, in accordance with various embodiments of the present invention. Steps 701-709 describe exemplary steps of the flowchart 700 in accordance with the various embodiments herein described.

Steps 701-705 are similar to corresponding steps 601-605 described above with respect to FIG. 6. That is, PCM is injected at step 701 in a cavity of a shield can structure that comprises two separate shield can layers. In one or more embodiments, the two separate shield can layers may be implemented from two separate layers of slightly different sizes, such that the outer shield can layer completely encapsulates the inner shield can layer with a cavity (and PCM) between the two layers. In one or more embodiments, one or both of the shield can layers may comprise a drawn and/or folded sheet of metal or metal alloy with high heat latency and conductivity that prevents penetration by electromagnetic waves, such as copper, stainless steel, etc. In one or more embodiments, the shield can may also consist of or other composite substances with similar properties, that include, for example silicone, elastomer, etc.

At step 703, the shield can layers are sealed so as to completely enclose the PCM material injected in the cavity between the shield can layers at step 701. An IC is mounted to a PCB at step 705. As described above with respect to FIGS. 5 and 6, the IC may likewise include, for example, one or more central processing units (CPUs), graphics processing units (GPUs), application processors (APs), multi-processors, special purpose processors, one or more system on a chip (SOCs), and/or one or more components for which insulation from electromagnetic radiation is desirable. According to one of more embodiments, the IC may be mounted to the PCB using a surface mount technology (SMT) technique.

At step 707, a the filled shield can structure created in steps 701 and 703 is disposed over the IC on the PCB. In one or more embodiments, the shield can structure is disposed over the IC so as to completely enclose the IC between the inner shield can layer and the PCB. In one or more embodiments, the shield can structure is disposed over the IC such that a gap is created between the inner shield can layer and the IC. At step 709, a phase-changing material (PCM) is deposited over the IC. In one or more embodiments, the PCM may be deposited in the directly over the IC in the gap between the inner shield can layer and the IC. Alternatively, the gap between the inner shield can layer and the IC may instead (or also), contain a volume of air.

Finally, at step 709, the shield can structure is sealed to remove contact with the ambient environment from the PCM material in the gap between the shield can structure and the IC. By integrating the thermally active material within the shield can layer(s), isothermal conditions can be maintained for a longer period of time, thereby extending the transient state of a heat-producing system for longer durations, which in turn may delay or prevent a throttling of a performance of the IC due to excessive heat while maintaining slim vertical profiles.

In the foregoing specification, embodiments have been described with reference to numerous specific details that may vary from implementation to implementation. Thus, the sole and exclusive indicator of what is the invention, and is intended by the applicant to be the invention, is the set of claims that issue from this application, in the specific form in which such claims issue, including any subsequent correction. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A computing system, comprising:
   a printed circuit board (PCB);
   an integrated circuit (IC) mounted on the PCB, wherein the IC performs processing to produce heat therefrom;
   a first sealed metal enclosure disposed on the PCB that encloses the IC;
   a second sealed metal enclosure disposed on the PCB that encloses the first sealed metal enclosure, wherein said second sealed metal enclosure covers at least a top surface and a side surface of said first sealed metal enclosure; and
   a volume of phase change material (PCM) deposited between the first sealed metal enclosure and the second sealed metal enclosure for absorbing heat produced by the IC so that an internal temperature of the computing system remains substantially constant and to extend a transient state period of heat transfer during an operation of the IC, and wherein further the first and second sealed metal enclosures and the volume of PCM retain heat produced by the IC.

2. The computing system according to claim 1, wherein the PCM substantially delays a start of a steady state period of heat transfer during operation of the IC.

3. The computing system according to claim 1, wherein the IC comprises at least one integrated circuit from the group of integrated circuits consisting of:
   a microprocessor;
   a graphics processor;
   a system-on-a-chip;
   an application processor;
   a central processing unit (CPU); and
   a special purpose processor.

4. The computing system according to claim 1, wherein the phase change material comprises at least one of:
   a solid-liquid phase change material;
   a liquid-vapor phase change material; and
   a crystalline to amorphous structure phase change material.

5. The computing system according to claim 4, wherein the phase change material is configured to change a current state of the phase change material when heat produced by the integrated circuit and absorbed by the phase change material exceeds a pre-determined threshold.

6. The computing system according to claim 5, further comprising a cavity disposed between the first sealed metal enclosure and the IC.

7. The computing system according to claim 6, wherein a second volume of PCM is deposited in the cavity.

8. The computing system according to claim 6, wherein a layer of air is disposed within the cavity.

9. The computing system according to claim 1, wherein the first sealed metal enclosure and the second sealed metal enclosure are soldered to the PCB.

* * * * *